United States Patent [19]

Caswell

[11] 3,995,197
[45] Nov. 30, 1976

[54] CATHODE RAY TUBE DISPLAY INTENSITY CONTROL SYSTEM

[75] Inventor: Robert L. Caswell, Placentia, Calif.

[73] Assignee: Rockwell International Corporation, El Segundo, Calif.

[22] Filed: Apr. 15, 1974

[21] Appl. No.: 461,177

[52] U.S. Cl. ............................. 315/383; 315/381; 328/146; 328/151
[51] Int. Cl.$^2$ ...................... H01J 29/52; H04B 1/04
[58] Field of Search ............. 315/30, 379, 386, 383, 315/381; 328/146, 151; 307/235 H, 235 T

[56] References Cited
UNITED STATES PATENTS

| | | | |
|---|---|---|---|
| 3,392,236 | 7/1968 | Nielsen et al. | 315/30 |
| 3,619,705 | 11/1971 | Waybright | 315/383 |
| 3,619,717 | 11/1971 | Lee | 315/383 |
| 3,863,162 | 1/1975 | Audenard et al. | 328/151 |

Primary Examiner—Maynard R. Wilbur
Assistant Examiner—S. C. Buczinski
Attorney, Agent, or Firm—H. Fredrick Hamann; G. Donald Weber, Jr.; Robert Ochis

[57] ABSTRACT

An intensity control system for a cathode ray tube (CRT) is disclosed. The system provides precise intensity control for a CRT whose control characteristics are only slowly varying. Precise intensity control is provided by measuring the cathode ray tube beam current. The beam current is set at a desired value without producing an image on the tube face. Thus, tube intensity can be set without fogging photoresponsive media which is in position for exposure by images on the cathode ray tube screen. The intensity may be set to a value determined by a manually adjustable intensity control. The intensity is preferably set by iterative threshold comparison of the actual beam current with the value corresponding to the setting of the intensity control. A unique threshold comparison circuit provides precise comparison between the reference level set by the intensity control and the actual beam current.

15 Claims, 3 Drawing Figures

CATHODE RAY TUBE DISPLAY INTENSITY CONTROL SYSTEM

BACKGROUND OF THE INVENTION

1. Field of the Invention

The invention relates to the field of cathode ray tube intensity control systems and more particularly to closed loop intensity control systems for cathode ray tubes.

2. Description of the Prior Art

Many cathode ray tube systems, including television receivers, display devices and the like have intensity controls which may be adjusted by an operator. To use such controls, the operator adjusts the itensity until it is satisfactory to him. Intensity controls of this variety control the voltage applied to the grid electrode of the electron gun and thereby control the intensity of the beam and image. Such systems provide no compensation for day to day and hour to hour variations in the control characteristics of the electron gun. Such systems are adequate for use with operator observed displays because of the wide dynamic range of the human eye.

Unfortunately such prior art systems do not provide the degree of control which is necessary in phototypesetters and other systems in which the cathode ray tube is employed to expose photoresponsive media. Such media generally have a response characteristic which is quite steep in the range which produces proper exposures. If exposed by a source whose intensity is insufficient, such media fail to produce a solid black image. On the other hand, if exposed by a source whose intensity is excessive, such media produce an image in which the transition between black and white areas of the image becomes fuzzy and the black areas become enlarged as a result of halo effects. Consequently, precise intensity control is needed in photoresponsive media exposure systems to provide high quality images which are comparable to those produced by metal type.

SUMMARY OF THE INVENTION

The invention provides precise image intensity control in a cathode ray tube system by measuring and setting the beam current to a preset reference value. An adjustable intensity control is provided. This control is preferably an adjustable resistance connected in series between the cathode ray tube and the high voltage power supply. The beam current through the adjustable resistance produces a corresponding voltage. The value of resistance to which the control is set determines the factor by which the current is multiplied in converting it to a voltage. The voltage across the current sensing resistance is amplified by a differential amplifier. The amplified voltage is applied to an input terminal of a sample and hold circuit. The output terminal of the sample and hold circuit is connected to a first input terminal of a voltage comparison circuit. The output of the amplifier is also connected to a second input terminal of the voltage comparison circuit.

The voltage comparison circuit is designed to have a predetermined input voltage offset, whereby the output signal from the voltage comparator changes sign when the input voltages differ by the predetermined offset voltage. Consequently, the voltage at the amplifier output when the cathode ray tube beam is off is sampled and stored in the sample and hold circuit. Thereafter, the beam is turned on to its set intensity. The voltage generated by the beam current is applied to the second input of the comparison circuit. When the beam-on voltage exceeds the beam-off voltage by the voltage comparison circuit offset, the threshold detector produces a first output value indicative thereof. If the beam-on voltage does not exceed the beam-off voltage by the comparison circuit threshold, then the comparison circuit produces a second type output indicative thereof. The combination of the sample and hold system and the constant-offset-voltage comparison circuit allow proper setting of the beam current independent of the cathode ray tube leakage current, amplifier offset, and slow variations in amplifier response over a broad range of those effects.

Maximum system flexibility and comparison precision are obtained through use of multipurpose logic level shifting circuitry in the threshold detector. A one shot sampling pulse generator is controlled by a logic signal having about a five volt swing. The low amplitude of the controlling signal makes the detector compatible with all types of integrated circuit control logic. The one shot sampling pulse generator produces an output signal having about a 25 volt swing. This large amplitude sampling pulse enables the detector to be constructed with field effect circuitry which operates with high precision.

To set the cathode ray tube intensity to a desired value, the intensity control resistor is adjusted to a corresponding value. The cathode ray tube beam aiming point is deflected off the portion of the face plate which generates a photomedia exposing display. The beam aiming point is held in this position. Once transients resulting from the deflection have died out, a sampling pulse is applied to the sample and hold circuit to store the output voltage of the amplifier. The cathode ray tube beam is then unblanked at the minimum remotely controllable intensity. The voltage stored in the sample and hold circuit is compared with the voltage generated by the amplifier in response to the unblanked beam current. If the unblanked voltage exceeds the blanked voltage by more than the threshold value of the voltage comparison circuit, the comparator provides the first type output. If the threshold is not exceeded, the comparator provides the second type output.

If the remotely controlled intensity does not exceed the threshold, then the remotely controlled intensity is increased and the process is repeated. In order to minimize the time necessary to set the intensity, the intensity may be increased in steps which are larger than the control resolution. If this is done, then when the threshold is first exceeded, the intensity is reduced to the next preceeding value and increased in finer steps until the minimum intensity which will exceed the threshold has been determined.

DETAILED DESCRIPTION OF THE PREFERRED EMBODIMENT

Figure 1:
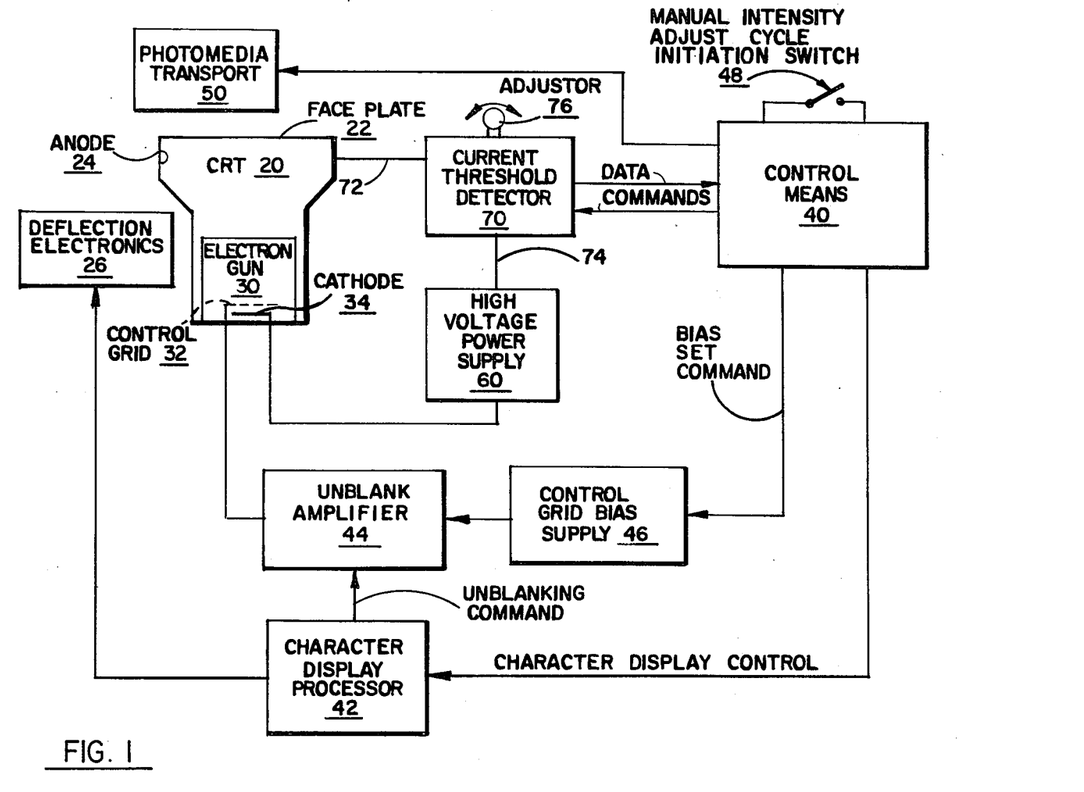
FIG. 1 is a schematic diagram in block form of a preferred embodiment of the inventive intensity control system.

An intensity control system in accordance with the preferred embodiment of the invention is illustrated in block diagram form in FIG. 1. A cathode ray tube 20 includes a display face plate 22, an anode 24 on the interior surface of the face plate, deflection electronics 26 and an electron gun 30. The electron gun 30 includes a cathode 34 and a control grid 32 for controlling the electron beam current. The cathode ray tube electron beam emanates from cathode 34 and is collected by anode 24. The voltage at control grid 32 controls the intensity of the electron beam striking the anode of the CRT. The voltage necessary to accelerate the electron beam for display purposes is supplied by a high voltage power supply 60 which is connected between the cathode and anode. A threshold current detector 70 is connected in series with the return lead from the anode 24 to the high voltage power supply 60. For clarity and correlation with the subsequent discussion of the current threshold detector 70 in FIG. 2, the lead from the anode to the threshold detector has been denominated 72 and the lead from the detector 70 to high voltage supply 60 has been denominated 74. Threshold detector 70 includes a threshold adjustor 76 and further includes an input terminal for receiving commands from a control means 40 and an output terminal for providing an indication of whether the threshold has been exceeded.

Control means 40 may be a computer and controls the overall display system and the threshold detection system. Computer 40 is adapted to receive a data signal from threshold detector 70 and to provide command signals to threshold detector 70. In addition, computer 40 controls the bias applied to control grid 32 through means of a control grid bias supply 46. Bias supply 46 is digitally settable to a plurality of bias values. These values are selected to cover the total range of desired intensity variation plus the reasonably anticipated drift in intensity of the cathode ray tube display.

Computer 40 also controls a character display processor 42 which controls the display of characters on the cathode ray tube screen. Processor 42 controls an amplifier 44 which controls the unblanking of the cathode ray tube beam. When amplifier 44 unblanks the beam, the preset control grid bias is applied to the control grid to produce an electron beam and display of corresponding intensity. Processor 42 also controls the deflection electronics 26 of cathode ray tube 20. For a more detailed description of a suitable processor see U.S. Applications Ser. No. 359,590 and 359,591, "Character Generating Method and System" of R. L. Caswell and G. W. Evans, respectively, assigned to the assignee of the present application.

Control means 40 may include a manual, intensity-adjustment cycle-initiation switch 48. Cycle initiation switch 48 enables an operator to force the system into an intensity adjustment cycle. This procedure may be employed after the operator has reset the intensity control to a new setting. In many cases this is not needed because an adjustment cycle can be performed each time the control means begins a series of exposures.

For those systems in which the cathode ray tube is employed for exposing photoresponsive media, a photomedia transport means 50 is disposed in front of the cathode ray tube faceplate 22. The photoresponsive media transport means is controlled by control means 40. This control enables control means 40 to establish a desired display format for the information transferred to the photoresponsive media.

Figure 2:
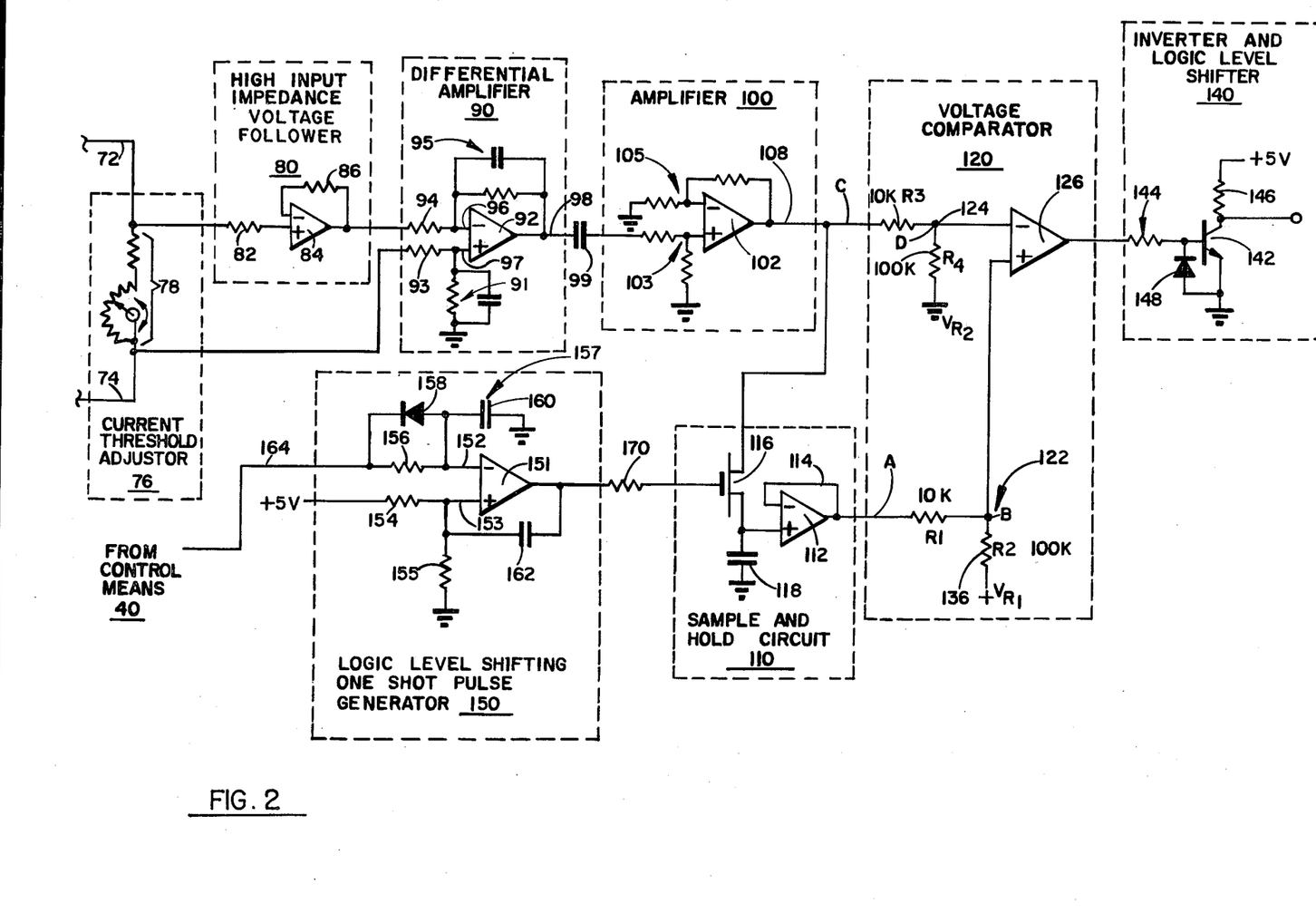
FIG. 2 is a schematic diagram of a preferred embodiment of a threshold comparison circuit in accordance with the invention.

Current threshold detector 70 is illustrated in schematic diagram form in FIG. 2. A variable resistance 78 is connected in series between lead 72 from anode 24 and lead 74 to high voltage supply 60. Return current from the anode 24 of the CRT flows through resistance 78. The voltage developed across resistor 78 is employed as indicator of the beam current. Resistor 78 comprises a manual current threshold adjustor for threshold detector 70. The voltage on the anode end of resistor 78 is applied to an input terminal of a high impedance voltage-follower 80. Voltage-follower 80 is employed to provide a high input impedance for the threshold detector in order to obtain an accurate current measurement and to prevent the flow of excessive current into the threshold detector. The output voltage of voltage-follower 80 is applied to a first input terminal of a differential amplifier 90. The second input terminal of differential amplifier 90 is connected to the high-voltage-power-supply side of resistor 78.

Differential amplifier 90 is comprised of an operational amplifier 92, two input resistors 93 and 94, a compensating network 91, and an RC feedback network 95. Feedback network 95 connects the output of amplifier 92 back to the first or inverting input terminal 96 thereof. Resistor 94 has one end thereof connected to input terminal 96 of amplifier 92. The second end of resistance 94 comprises the first input terminal of differential amplifier 90. Resistor 93 has one end thereof connected to the second or non-inverting input terminal 97 of amplifier 92. Compensating network 91, connected from the non-inverting input of amplifier 92 to ground, balances the voltage at the inverting and non-inverting inputs for common mode input to provide rejection of common mode inputs. The second end of resistor 93 comprises the second input terminal of differential amplifier 90. Feedback network 95 stabilizes the overall gain of differential amplifier 90 to assure that a constant and reliable voltage amplification is provided.

As a result of the connection of its input terminals, differential amplifier 90 amplifies the voltage appearing across resistor 78. The quantity of current required to produce a given voltage across resistors 78 depends on the setting of the adjustable 78. Consequently, the lower the resistance 78, the greater is the quantity of current required to produce a given voltage at the input terminals to differential amplifier 90.

The output terminal of differential amplifier 90 is connected to an input terminal of a second differential amplifier 100 through capacitor 99. Capacitor 99 blocks DC signals resulting from offsets of prior amplifying stages or leakage of current through the CRT. Otherwise these signals could saturate later stages and cause desired data to be lost. The value of capacitor 99 is chosen large enough to avoid any significant change in circuit output over the longest time for which stable operation is necessary (typically not more than a few milliseconds).

Amplifier 100 comprises an operational amplifier 102 and two voltage divider networks 103 and 105. Voltage divider network 105 has one end thereof connected to the output terminal of amplifier 102 and the other end thereof connected to a source of a reference potential such as ground voltage. The tap of divider network 105 is connected to the first or inverting input terminal of amplifier 102. Voltage divider network 105 provides negative feedback around operational amplifier 102 to stabilize the amplification of amplifier 100 at a pre-established value.

One end of voltage divider network 103 comprises the input terminal of amplifier 100. The other end of network 103 is connected to a source of a reference potential such as ground voltage. Voltage divider network 103 is connected to a second or non-inverting input terminal of amplifier 102.

Amplifiers 90 and 100 together will provide a desired amplification factor for the voltage across resistor 78. In the illustrated embodiment this gain factor is 500.

A sample and hold circuit 110 has a data voltage input terminal thereof connected to the output terminal of amplifier 100. Sample and hold circuit 110, when triggered, will sample the voltage at the output terminal of amplifier 100 and store that voltage. Sample and hold circuit 110 provides the stored voltage at an output terminal thereof.

The output terminal of sample and hold circuit 110 is connected to a first input terminal of a voltage comparator circuit 120.

Voltage comparator circuit 120 comprises a first and second voltage divider networks 122 and 124, respectively, and a high input impedance high gain amplifier 126. Voltage divider network 122 is comprised of resistors R1 and R2. The inner end of resistors R1 and R2 form a common connection at an output node of the voltage divider network. The output node of voltage divider 122 is connected to a first or non-inverting input terminal of the high gain amplifier 126 which may be an operational amplifier. Because amplifier 126 serves as a voltage comparator, the compensation networks normally present are not needed. The outer end of the resistor R1 constitutes the first input terminal of voltage comparator circuit 120 and is connected to the output terminal of sample and hold circuit 110. The outer end of resistor R2 is connected to a source of a reference potential $V_{R1}$ such as +15 volts.

The second voltage divider network 124 is comprised of resistors R3 and R4. The inner ends of resistors R3 and R4 form a common connection at the output node of divider network 124. The output node of divider 124 is connected to the second (inverting) input terminal of high gain amplifier 126. The outer end of resistor R3 constitutes a second input terminal of voltage comparator circuit 120 and is connected to the output terminal 108 of amplifier 100. The outer end of resistor R4 is connected to a source of a reference potential $V_{R2}$ such as ground voltage.

For convenience in the following discussion, the first input terminal of voltage comparator circuit 120 has been labeled as node A in FIG. 2 and the voltage thereat will be denominated $V_A$. The output node of divider network 122 has been labeled as node B in FIG. 2 and the voltage thereat will be denominated $V_B$. In a similar fashion the second input terminal of voltage comparator circuit 120 has been labeled as node C and the output node of divider network 124 has been labeled as node D. The voltages at nodes C and D will be denominated $V_C$ and $V_D$.

For clarity in the succeeding discussions, the operational characteristics of voltage comparator circuit 120 will be derived here.

In voltage divider network 122, the voltage $V_B$ at node B may be expressed by the following equation (since the inputs to high gain amplifier 126 are high impedance and their loading can be neglected):

$$V_B = V_{R_1} - (V_{R_1} - V_A)\left(\frac{R_2}{R_1 + R_2}\right) \qquad (1)$$

The voltage $V_D$ at node D may be expressed by the following equation:

$$V_D = V_{R_2} - (V_{R_2} - V_c)\left(\frac{R_4}{R_3 + R_4}\right) \qquad (2)$$

The output of operational amplifier 126 will be 0 volts when the voltages at its input terminals are equal. This is the threshold condition between the generation of a positive output voltage and a negative output voltage by operational amplifier 126. Thus, the threshold condition obtains when:
$$V_B = V_D \qquad (3)$$

Substituting equations 1 and 2 into equations 3 and solving for the voltage at node C yields:

$$V_C = \left(\frac{R_3 + R_4}{R_4}\right)\left(\frac{R_2}{R_1 + R_2}\right)V_A + \left(\frac{R_3 + R_4}{R_4}\right)\left(\frac{R_1}{R_1 + R_2}\right)V_{R_1} - \frac{R_3}{R_4}V_{R_2} \qquad (4)$$

This general expression provides a threshold condition where the threshold offset between the voltages at nodes A and C varies as those voltages vary. However, where:

$$\frac{R_2}{R_1 + R_2} = \frac{R_4}{R_3 + R_4} \qquad (5)$$

equation 4 reduces to:

$$V_C = V_A + \left(\frac{R_1}{R_2}\right)V_{R_1} - \left(\frac{R_3}{R_4}\right)V_{R_2} \qquad (6)$$

and the threshold condition is a constant offset between the voltage at node A and the voltage at node C, independent of the values of these voltages. Where the first and second voltage dividers are identical,
$$R_1 = R_3 \ \& \ R_2 = R_4 \qquad (7)$$

and the expression for the voltage at node C reduces to $$V_C = V_A + \left(\frac{R_1}{R_2}\right)(V_{R_1} - V_{R_2}) \qquad (8)$$

In the embodiment illustrated in FIG. 2, the following relationships also apply:
$R_2 = 10R_1$, $V_{R_1} = 15v$ & $V_{R_2} = 0v$ (9)
Substituting these values into equation (8) yields
$V_C = V_A + 1.5$ volts (10)
The total amplification of the combination of amplifiers 90 and 100 is 500. Therefore, the voltage offset of 1.5 volts corresponds to a three millivolt change in the voltage across resistor 78 between the blanked and unblanked condition of the cathode ray tube beam. Because of the constant offset, even drastic changes in the voltage of the output of amplifier 100, will not affect the intensity of the beam which is set by this current threshold detection technique. In many cases capacitor 99 can be omitted and the effects of all offsets and leakage through the CRT can be controlled by the sample and hold reference and the constant offset comparator. In that case, the voltage generated by a constant leakage current is compensated by the sample and hold comparison system and the leakage voltage is thus proportional to the value of resistor 78. As the desired intensity decreases, the resistance of resistor 78 is increased. Consequently, the "leakage" voltage at node A will increase significantly as the intensity setting is decreased. Thus, the constant voltage offset characteristic is important even in the absence of cathode ray tube changes.

In some cases the sample and hold circuit can be omitted and a fixed voltage threshold for the output of amplifier 100 employed. In an extremely undemanding application this would even be possible without capacitor 99.

The output terminal of voltage comparator circuit 120 is connected to the input terminal of a combination Inverter and logic level shifter 140. Logic level shifter 140 allows the voltage comparator to employ a high gain amplifier which operates from +15 volts and −15 volts power supplies while driving T²L logic circuitry which operates from a +5 volt power supply.

Sample and hold circuit 110 is controlled by a logic level shifting one-shot pulse generator 150. The logic level shift enables the threshold detector to be controlled by T²L logic even though the remainder of the detector employs FET circuitry.

Logic level shifter 150 comprises a high input impedance high gain amplifier 151 and appropriate input and feedback circuitry. Amplifier 151 may be an operational amplifier. However, like amplifier 126, amplifier 151 does not require the compensating networks which are normally included in an operational amplifier. A control input terminal of one-shot pulse generator 150 is connected to a first or inverting input terminal 152 of amplifier 151 through a pulse stretching network 157. Pulse stretcher 157 comprises a storage capacitor 160 and a parallel combination of a resistor 156 and a diode 158. Diode 158 has the cathode thereof connected to the first input terminal 152 of amplifier 151 and the anode thereof connected to a control signal input conductor 164. Capacitor 160 is connected between input terminal 152 of amplifier 151 and ground.

When the system is put in an intensity adjust mode, the following sequence of events is preferable. First, control means 40 sets the control grid bias supply 46 to generate its most negative supply voltage. This most negative voltage corresponds to a minimum intensity display. An intensity adjust character is transmitted from control means 40 to processor 42 to control the operation of the CRT.

In response to the intensity adjust character, the processor 42 provides a deflection signal to deflection electronics 26. This deflection signal drives the electron beam aiming point off the display face of the cathode ray tube. The deflection signal holds the beam aiming point in that position by saturating the deflection electronics. In order that transients within the system which result from the beam deflection may die out, a short period of time is allowed to elapse.

Although the beam current is held to zero at this time there will be some leakage current from cathode 34 to anode 24 of the cathode ray tube. Some of this leakage current is intentional in order to aid in establishing a uniform electron accelerating potential between the cathode and the anode. An additional portion of this leakage current may be unintentional leakage from other current paths between the cathode and the anode. Whatever the source of the leakage current, it must flow through return lead 72 from anode 24 into the current threshold detector 70. Because voltage follower 80 has a high input impedance, substantially all of the leakage current will flow through resistance 78. In resistance 78, the current will induce a voltage drop equal to the value of the current times the value of resistance 78. From resistance 78, the leakage current will return to high voltage power supply 60 through lead 74.

The voltage across resister 78 is applied as input signal to differential amplifier 90. Differential amplifier 90 amplifies this input voltage and applies the amplified voltage to its output terminal 98.

The output voltage of amplifier 90 serves as the input signal to amplifier 100. Amplifier 100 amplifies its input signal and applies the re-amplified signal to its output terminal 108.

While the electron gun aiming point is being deflected in response to the intensity adjusting character, the leakage current through cathode ray tube 20 may vary. The voltage at output terminal 108 will vary correspondingly. The leakage current and the voltage at terminal 108 will stabilize as any transients resulting from the deflection die out. Once the transients have had time to die out control means 40 applies to a sampling command to the logic level shifting one-shot pulse generator 150 via conductor 164. The sampling command initiates the taking of a sample by sample-and-hold circuit 110.

When one-shot 150 is quiescent, the voltage divider network comprised of resistors 154 and 155 applies a voltage of approximately +2 volts to the second input terminal 153 of operational amplifier 151. When one-shot 150 is quiescent, conductor 164 is held at roughly plus 5 volts, a T²L logical one voltage level. In order to generate the one shot pulse and take a sample, conductor 164 is momentarily driven to a logic zero level of substantially ground voltage. This pulls the voltage at input terminal 152 of amplifier 151 to substantially ground voltage. A normal T²L control pulse is not sufficiently long to assure the triggering at one-sot 150. Consequently, a pulse stretching network comprised of resistor 156, diode 158 and capacitor 160 is connected between conductor 164 and input terminal 153 of amplifier 151. The pulse stretching network applies a pulse to terminal 152 which is long enough to assure the triggering of the one shot.

Because the first input terminal 152 of amplifier 151 is the inverting input terminal, the output voltage of amplifier 151 is at its most negative value when the voltage at terminal 152 is significantly more positive than the voltage at terminal 153. Where operational amplifier 151 is operated from positve and negative 15 volt supplies, this most negative voltage will be on the order of −13 volts. As the voltage at terminal 152 decreases in response to the sample command on conductor 164, the output voltage from amplifier 151 increases toward ground voltage. As the voltage at the output of amplifier 151 increases toward ground voltage, feedback capacitor 162 drives the voltage at input terminal 153 more positive. This positive feedback reinforces the more positive movement of the output voltage and assures that the output voltage of amplifier 151 is driven to its most positive voltage (about +13 volts). After the sample taking command is removed from conductor 164 the voltage on conductor 164 returns to 5 volts. The voltage at input terminal 153 returns to +5 volts as capacitor 160 charges through resistor 156.

Simultaneously, capacitor 162 discharges through the parallel combination of resistors 154 and 155. When capacitor 162 has discharged sufficiently that the voltage at input 153 is barely more positive than the voltage at input 152, the output voltage of amplifier 151 will begin to decrease toward ground voltage. The coupling effect of feedback capacitor 162 will drive the voltage at input terminal 153 rapidly negative as the output voltages decreases. This forces the output voltage of amplifier 151 to its most negative value very rapidly. Thereafter, feedback capacitor 162 will charge through resistors 154 and 155 until the voltage at input terminal 153 of operational amplifier 151 returns to its quiescent value of approximately 2 volts.

The positive voltage at the output terminal of amplifier 151 constitutes a sample taking pulse. The output voltage of amplifier 151 is applied to the gate electrode of field effect transistor 116 through a connecting resistor 170. Field effect transistor 116 constitutes the sample taking switch of sample-and-hold circuit 110. The source of transistor 116 is connected to the output terminal 108 of amplifier 100 and the drain thereof is connected to storage capacitor 118. Consequently, during the period that transistor 116 is conductive the voltage at terminal 108 charges holding capacitor 118 to that voltage. Operational amplifier 112 serves as a voltage follower and applies the sample voltage to the output terminal of sample-and-hold circuit 110. When the sample taking pulse terminates, transistor 116 becomes non-conductive thereby isolating holding capacitor 118 from terminal 108.

When the sampling pulse from amplifier 151 terminates, the voltage at the output terminal (node A) of sample-and-hold circuit 110 is equal to the output voltage at terminal 108 (node C) of amplifer 100. The voltage at nodes A and C constitute the input voltages to voltage comparator 120. As was explained hereinabove, with equal voltages applied to the input terminals thereof, voltage comparator 120 produces its maximum positive output voltage. This maximum voltage is approximately 13 volts where operational amplifier 126 operates from positive and negative 15 volts supplies. This positive voltage applied to the input terminal of inverter-and-logic-level-shifter 140 turns transistor 142 on hard and yields a zero logic signal at the output of logic level shifter 140. This output signal is not utilized because no comparison has been performed at this time.

Once the sample has been taken (as described above), processor 42 sends an unblanking command to amplifier 44. In response to the unblanking command, amplifier 44 applies the unblanking pulse in addition to the preset control grid bias to the control grid 32 of electron gun 30. Because the control grid bias supply 46 has been preset to its most negative voltage, there will be only a small (if any) increase in the current of cathode ray tube 20.

The leakage current from the cathode ray tube plus the beam current flows through lead 72 to resistor 78. The increased current flow through the unchanged resistance of resistor 78 produces a larger voltage at the input terminals of amplifier 90 than was present in the absence of the beam current. This increased voltage is amplified by amplifier 90 and applied to amplifier 100. Amplifier 100 similary amplifies the increased voltage and applies the reamplified signal to output terminal 108. If the increase in voltage at node C is less than 1.5 volts, the threshold condition is not met and the output signal from voltage comparator 120 remains at its most positive value. As a consequence, the output from logic level shifter 140 remains a logical zero. Control means 40 treats the return signal from logic logic level shifter 140 as an indication that the preset control grid bias is too low to produce the desired intensity.

Logic means may be inserted between logic level shifter 140 and control means 40 to provide a data signal to control means 40 only at the times that one is needed or when a valid comparison signal exists.

After an appropriate period of time, processor 42 terminates its unblanking command to amplifier 44 and the beam current is turned off. Thereafter, in response to the previous zero-value logic signal from level shifter 140 control means 40 increases the preset value of the control grid bias. In order to set the intensity in an acceptably small number of iterations, but while preventing fogging of any photo responsive media exposed to faceplate 22, control means 40 increases the preset control grid bias by 4 units. This process is repeated as many times as is required to produce a beam current which exceeds the threshold.

At the control grid bias setting which first exceeds the threshold the following events occur during the threshold test cycle. First, a sample of the quiescent or leakage current is taken in the manner described previously. Thereafter, the beam is unblanked by amplifier 44 in response to the unblanking signal. The new value of current generates a voltage across resister 78 which is enough larger (3 millivolts in the described embodiment) than the leakage current voltage to exceed the threshold. This voltage is applied to the input terminals of differential amplifier 90 where it is amplified. The amplified output voltage from amplifier 90 is applied to the input terminal of amplifier 100. The re-amplified output voltage of amplifier 100 at terminal 108 is applied to the second input terminal of voltage comparator 120. As has been postulated above, this voltage is sufficient to exceed the voltage at node A by more than the voltage comparator offset voltage (+1.5 volts in the described embodiment). These input signals to operational amplifier 126 will cause amplifier 126 to produce an output voltage which is not sufficiently positive to turn transistor 142 on. Thus, logic level shifter 140 generates a logic "one" signal at the output terminal thereof.

Once the threshold has been exceeded, the present control grid bias is reset to one unit higher than the last tested value which did not exceed the threshold. Threshold tests are repeated wih unit increases between tests until the threshold is once again exceeded. The corresponding preset control grid bias voltage is then used for the subsequent display of information.

The above-described embodiment of the invention is effective to provide accurate resettability of display intensity through the use of the intensity control. When the cathode ray tube is first activated, its control characteristics change fairly rapidly with time due to thermal expansion of components of the electron gun as the tube temperature increases. The period of time during which rapid control characteristic changes occur will depend on a particular cathode ray tube employed. However, this period will normally be on the order of ½ hour.

Once the initial warmup has occurred, the intensity of the cathode ray tube display can be accurately set by adjusting intensity control 76. Intensity adjustment is performed as follows.

The manner in which it is determined to adjust the intensity can vary. Preferably control means 40 automatically goes into an intensity setting cycle when means 40 is first set in an operational mode which displays information on the cathode ray tube. Similarly, each time the photographic media transport means is energized in perparation for an exposure run, an intensity adjusting cycle is preferably initiated. Finally, whenever the operator desires to change the intensity he may activate the intensity adjust switch.

It will be understood, that in systems which present no problem of fogging the photographic media a process requiring fewer iterative steps may be employed. One such process employs a preset control grid bias which is in the middle of the range within which the threshold is known to lie. In this manner, the initial test is performed with a preset voltage of one-half of the maximum. The second test is performed with a preset voltage of one-quarter or three-quarters of the maximum in accordance with whether the threshold was exceeded or was not exceeded in the first test, respectively. This process is repeated with successive divisions into eighths, sixteenths, thirty-seconds, etc. of the range until the minimum value which exceeds the threshold is determined.

Figure 3:
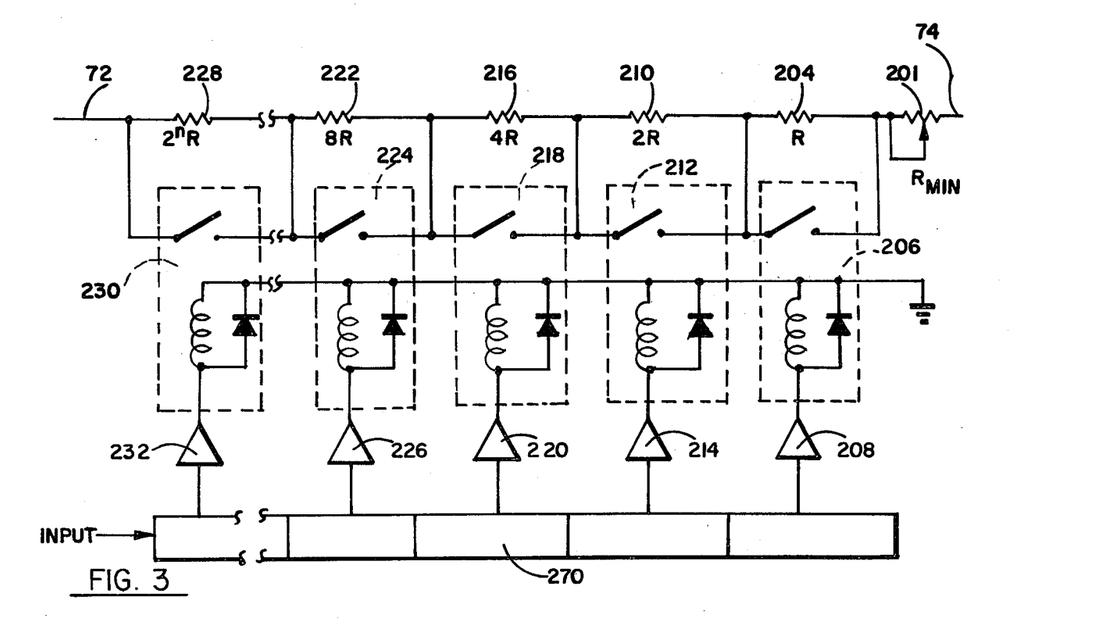
FIG. 3 is a schematic block diagram of a computer controllable intensity setting resistance.

FIG. 3 is a circuit diagram of an electronically controlled resistance 200 which may be employed in place of manually variable resistors 78 if it is desired to enable computer control of the intensity setting. Control for resistor network 200 comprises a resistor 201 which establishes a minimum resistance of the network and a series connection of resistors having binary relationships. That is, the resistors (204, 210, 216, 222, ...) have values of R, 2R, 4R, 8R..., respectively. Each of the resistors is connected in parallel with an electronically controllable switch which can selectively short out the resistor. The electronically controlled switches are in turn controllable by control means 40. The method of control is illustrated as a register 270 in which a control word is placed. A switch control driver (208, 214, 220,...) is connected between each register stage and a corresponding controllable switch (206, 212, 218,...). Each controllable switch is normally open and may be selectively closed to short out the corresponding resistor. When a logical one is stored in a stage of register 270, the corresponding switch closes, thereby shorting the corresponding resistance. Thus, the value of the resistance of network 200 is established by the number which is stored in register 270. This enables control means 40 to control the value of the resistance by inserting a corresponding numeral in register 270.

When it is desired to set resistor network 200 to a resistance to produce a desired intensity, a digital number corresponding to the required swich setting is entered in register 270. This causes the appropriate switches to close thereby shorting out the proper resistors of the binary series. Thereafter, the intensity is adjusted in the same fashion as with the manually adjustable variable resistor. Thus, the intensity control within the system can be completely automatic.

It will be noted, that the value R of the units resistor 202 of the binary series must be small enough to provide the degree of intensity resolution which is required for establishing desired intensity levels in the display.

Although the intensity adjustment has been described in terms of a processor, any means of controlling the beam aiming point and beam unblanking may be employed which provides the necessary functions.

In accordance with the above description a preferred embodiment of a cathode ray tube intensity control system has been described which provide precise control of the display intensity. It will be understood, that those skilled in the art will be able to make varying changes in the system. However, the described embodiment is intended to be illustrative, not limitative and the scope of the invention is to be limited only by the appended claims.

I claim:

1. An intensity control system for a cathode ray tube comprising in combination:
   control means:
   current measurement means for measuring the cathode-ray-tube beam current, said current measurement means connected to said control means to receive commands therefrom and to supply output signals thereto, said current measurement means including a current threshold detector for generating a first type output signal when said beam current exceeds a predetermined threshold condition and for providing a second type output when said beam current does not exceed said predetermined threshold condition; and
   beam current adjustment means for adjusting said cathode-ray-tube beam current;
   said control means controlling said current measurement means and said beam current adjustment means to adjust said beam current to satisfy a predetermined condition.

2. The intensity control system recited in Claim 1 wherein said current measurement means includes means to minimize any error introduced into the current measurement by any leakage current in the cathode ray tube which flows in the same circuit as said beam current.

3. The intensity control system recited in claim 1 further comprising means for deflecting the cathode ray tube electron beam off the viewing face of said cathode ray tube to minimize any light emitted by the cathode ray tube display during the current measurement process.

4. The intensity control system recited in Claim 1 wherein said current measurement means includes resistance means in series with said beam current for generating a voltage proportional to said beam current.

5. The intensity control recited in claim 4 wherein said resistance is remotely controllable by said control means.

6. The intensity control system recited in claim 4 wherein said resistance is manually variable and provides a resistance which decreases substantially logarithmically with linear adjustment of said manual setting.

7. An intensity control system for a cathode ray tube comprising in combination:
   current measurement means for measuring the cathode ray tube current, said current measurement means including:
   current to voltage conversion means for generating a voltage representative of the cathode ray tube beam current;
   sample and hold means for storing a voltage representative of a cathode ray tube beam-off leakage current, said sample and hold means having a sample input terminal and a stored voltage output terminal;
   a two-input voltage comparison means having a first input terminal thereof connected to the output terminal of said sample and hold means, and having a second input terminal thereof connected to receive a voltage representative of the cathode-ray-tube beam-on current, said voltage comparison means generating a first type output signal when said beam-off and beam-on voltages satisfy a predetermined relationship and generating a second type output signal when said voltages do not satisfy said predetermined relationship;
   beam current adjustment means for adjusting said cathode-ray-tube beam current, and
   control means for controlling said current measurement means and said beam current means for adjusting said beam or current to satisfy a predetermined condition.

8. The intensity control system recited in Claim 7 wherein said voltage comparison means comprises:
   high gain amplifier means having a first non-inverting input terminal, a second inverting input terminal and an output terminal;
   first voltage divider means having a first end thereof comprising said first input terminal of said voltage comparison means, having a second end thereof connected to a source of a first reference voltage and having a tap thereof connected to the first input terminal of said amplifier means; and
   second voltage divider means having a first end thereof comprising the second input terminal of said voltage comparsion means, having a second end thereof connected to a source of a second reference potential different from said first reference potential and having a tap thereof connected to said second input terminal of said amplifier means.

9. Voltage comparison means as recited in claim 8 wherein the first and second voltage dividers have equal division ratios whereby the output of said voltage comparator will change states when the voltage input signal at one of said input terminals exceeds the voltage at the other input terminal by a predetermined, fixed amount.

10. Voltage comparison means having first and second input terminals and an output terminal, said comparison means comprising, in combination:
   high gain amplifier means having a first non-inverting input terminal, a second inverting input terminal and an output terminal;
   first voltage divider means having a tap thereof connected to said first input terminal of said amplifier means, a first end of said first voltage divider means comprising said first input terminal of said voltage comparison means, and a second end of said first voltage divider means connected to a source of a first reference potential;
   said second voltage divider means having a tap thereof connected to said second input terminal of said amplifier means, a first end of said second voltage divider means comprising said second input terminal of said voltage comparison means, and a second end of said second voltage divider means connected to a source of a second reference potential different from said first reference potential whereby the input voltages to the first and second input terminals of said amplifier means are equal when the first input voltage to said comparison means is a first constant multiple of the second input voltage to said voltage comparison means plus a second constant multiple of the first reference potential minus a third constant multiple of said second reference potential.

11. Voltage comparison means as recited in Claim 10 wherein the first and second voltage divider means have equal division ratios whereby said first constant is one and the output of said voltage comparator will change states when the voltage input signal at one of said input terminals of said comparison means exceeds the voltage at the other input terminal of said comparison means by a predetermined, fixed, non-zero, amount.

12. Voltage threshold detection means for determining whether a first voltage is exceeded by a second voltage by more than a predetermined threshold voltage, said means comprising in combination:
   differential amplifier means having an output terminal;
   voltage sample and hold circuit means for sampling and storing the voltage at the output terminal of said differential amplifier means, said sample and hold circuit means having a control input terminal, a sample input terminal connected to the output terminal of the differential amplifier means and an output terminal;
   voltage comparator means having first and second input terminals and an output terminal, said first input terminal connected to the output terminal of said sample and hold circuit means and said second input terminal connected to the output terminal of said differential amplifier means, said voltage comparator means providing a first output signal at the output terminal thereof when the input voltages at the input terminals thereof satisfy a predetermined relationship and providing a second output signal at the output terminal thereof when the input voltages do not satisfy the predetermined relationship.

13. The voltage threshold detection circuit of claim 12 wherein said voltage comparator means further comprises:
   high gain amplifier means having first and second input terminals, one of said input terminals being inverting and the other of said input terminals being non-inverting;
   voltage offset means for establishing a predetermined relationship in which the threshold condition for the input voltages satisfying the predetermined relationship occurs when there is a non-zero offset between the input voltages.

14. The voltage threshold detector of claim 13 wherein said voltage offset means comprises:
   first voltage divider means having an ouput tap connected to one of the input terminals of said high gain amplifier, having one end of the voltage divider means connected to a first reference voltage and the other end of said voltage divider means comprising the first input terminal of said voltage comparator means; and second voltage divider means having an output tap connected to the other input terminal of said high gain amplifier means, a first end of said voltage divider means being connected to a source of a second reference potential and the second end of said voltage divider means constituting the second input terminal of said voltage comparator.

15. The threshold detector recited in claim 14 further comprising a logic level shifting one-shot pulse generator comprising:

an output terminal electrically connected to the control input terminal of said sample and hold circuit;

a control input terminal, the receipt of an appropriate pulse at which causes the one-shot pulse generator to generate a single pulse; and the voltage swing available at the output terminal of said one-shot pulse generator is substantially greater than the voltage swing required of control signals at the input terminal thereof.

* * * * *